US012460654B2

United States Patent
Liu et al.

(10) Patent No.: US 12,460,654 B2
(45) Date of Patent: Nov. 4, 2025

(54) FAN WITH ELECTROMAGNETIC RADIATION SHIELDING STRUCTURE

(71) Applicant: ASIA VITAL COMPONENTS (CHINA) CO., LTD., Shenzhen (CN)

(72) Inventors: Feng Liu, Shenzhen (CN); Hu Zhang, Shenzhen (CN); Guang-Dong Liu, Shenzhen (CN)

(73) Assignee: ASIA VITAL COMPONENTS (CHINA) CO., LTD., Shenzhen (CN)

( * ) Notice: Subject to any disclaimer, the term of this patent is extended or adjusted under 35 U.S.C. 154(b) by 0 days.

(21) Appl. No.: 18/581,578

(22) Filed: Feb. 20, 2024

(65) Prior Publication Data
US 2025/0243867 A1   Jul. 31, 2025

(30) Foreign Application Priority Data
Jan. 30, 2024   (TW) ................. 113103583

(51) Int. Cl.
| | | |
|---|---|---|
| F04D 25/06 | (2006.01) | |
| F04D 25/08 | (2006.01) | |
| H05K 9/00 | (2006.01) | |

(52) U.S. Cl.
CPC ..... *F04D 25/0606* (2013.01); *F04D 25/0613* (2013.01); *F04D 25/0646* (2013.01); *F04D 25/08* (2013.01); *H05K 9/0009* (2013.01)

(58) Field of Classification Search
CPC ............. F04D 25/0606; F04D 25/0613; F04D 25/0646; F04D 25/08; H05K 9/0009
See application file for complete search history.

(56) References Cited

U.S. PATENT DOCUMENTS 5,610,462 A  *  3/1997  Takahashi ............ H02K 5/1675
                                                        310/90
6,483,209 B1 * 11/2002  Horng ...................... H02K 7/09
                                                        310/89
(Continued)

FOREIGN PATENT DOCUMENTS

| CN | 1613174 A | 5/2005 |
|---|---|---|
| EP | 4224175 A1 | 8/2023 |

(Continued)

OTHER PUBLICATIONS

Search Report dated May 8, 2024 issued by Taiwan Intellectual Property Office for counterpart application No. 113103583.

*Primary Examiner* — Audrey B. Walter
(74) *Attorney, Agent, or Firm* — Demian K. Jackson; Jackson IPG PLLC

(57) ABSTRACT

A fan with electromagnetic radiation shielding structure includes a fan impeller and a shaft seat. The fan impeller includes a metal hub, a plurality of blades circumferentially spaced on an outer surface of the metal hub, and a magnetic element provided on an inner surface of the metal hub. The shaft seat is provided at a central area with an upward projected shaft barrel, which is rotatably connected to the fan impeller and has a stator externally fitted therearound. A metal carrier is provided on the shaft seat and has a peripheral edge extended upward to form a sidewall and define an open-topped receiving space for receiving the stator therein. The metal hub and the metal carrier together define a shielding space, such that the stator is located in the shielding space and isolated from outer environment to avoid leakage of electromagnetic radiation produced by the stator.

5 Claims, 8 Drawing Sheets

(56) References Cited

U.S. PATENT DOCUMENTS

| | | | |
|---|---|---|---|
| 8,092,195 B2* | 1/2012 | Muraoka | F04D 25/0633 |
| | | | 417/423.1 |
| 8,207,643 B2* | 6/2012 | Horng | H02K 5/1675 |
| | | | 310/90 |
| 8,253,286 B2* | 8/2012 | Yabuuchi | H02K 5/163 |
| | | | 310/67 R |
| 11,622,477 B2 | 4/2023 | Lu | |
| 2006/0131972 A1* | 6/2006 | Yang | F16C 39/06 |
| | | | 310/90.5 |
| 2006/0181160 A1* | 8/2006 | Chen | H02K 7/09 |
| | | | 310/168 |
| 2006/0232150 A1* | 10/2006 | Horng | H02K 7/09 |
| | | | 310/68 B |
| 2007/0176504 A1* | 8/2007 | Otsuki | F16C 39/063 |
| | | | 310/90 |
| 2007/0252451 A1* | 11/2007 | Shibuya | F04D 29/5806 |
| | | | 310/67 R |
| 2020/0300254 A1* | 9/2020 | Kim | H02K 11/33 |

FOREIGN PATENT DOCUMENTS

| | | |
|---|---|---|
| TW | 201906281 A | 2/2019 |
| TW | M641995 U | 6/2023 |
| TW | M655140 U | 5/2024 |

* cited by examiner

FAN WITH ELECTROMAGNETIC RADIATION SHIELDING STRUCTURE

This application claims the priority benefit of Taiwan patent application number 113103583 filed on Jan. 30, 2024.

FIELD OF THE INVENTION

The present invention relates to a fan with electromagnetic radiation shielding structure, and more particularly, to a fan with electromagnetic radiation shielding structure, with which electromagnetic radiation produced by windings of a stator structure and/or electronic elements on a circuit board of the fan is effectively prevented from leaking out of the fan.

BACKGROUND OF THE INVENTION

While the currently available electronic elements have quickly increased working frequency, they also produce more and more heat during operation. The produced heat must be carried away from these electronic elements and the devices using them as soon as possible, lest the electronic elements should be overheated and lose stable operation or even be burnt out. To solve the problem of removing the heat produced by the high-performance electronic elements, related manufacturers would usually attach a heat dissipation device to the electronic elements and use a cooling fan to achieve forced heat dissipation.

At present, a large part of the cooling fans are mounted on an electronic device, such as a server, a computer, and a notebook computer, or on a power-driven vehicle such as an automobile, so as to enable forced heat dissipation of the electronic device and the powder-driven vehicle. The conventional cooling fan generally includes a shaft seat, a stator, and an impeller having a plurality of blades. The shaft seat is rotatably connected to a shaft of the impeller; the stator is fitted on around the shaft seat; a circuit board is provided below the stator; and the impeller is fitted around an outer side of the stator. The stator includes a set of silicon steel laminations and a set of windings wound around the silicon steel laminations. The set of silicon steel laminations is fitted around the shaft seat corresponding to a magnetic element provided on an inner surface of the impeller. The silicon steel laminations have an end electrically connected to the circuit board, and a plurality of electronic elements, such as a microprocessor, a single-chip microcontroller unit, and a motor driving chip and a motor driving circuit consisting of a plurality of transistors, are mounted on the circuit board. When a current is supplied to the fan, the stator and the magnetic element on the impeller are driven to operate due to current-induced magnetic excitation. At this point, the windings of the stator and the electronic elements on the circuit board would produce electromagnetic radiation, which might leak from the fan to interfere with surrounding sensitive electronic elements or devices. A minor leakage might lead to sudden failure, abnormality or false operation of the surrounding sensitive electronic elements. In some worse conditions, the electromagnetic radiation leakage might result in damaged electronic elements.

To improve the electromagnetic interference (EMI) problem in the conventional fan structure, the ways adopted by related manufacturers include, for example, increasing the filtering capability of the power supply circuit of the fan for the electronic elements on the circuit board, and reducing the chopping speed of the upper and lower bridge transistor switches to reduce the EMI value (i.e. a dB value). Further, some manufacturers try to reduce the EMI value of some currently available thin-type fans by driving an integrated circuit (IC) embedded metal oxide semiconductor (MOS) transistor switch using a motor. However, the above ways are not so idea and have relatively limited influence on the reduction of EMI value. In some well-known fan EMC tests, including the radio frequency interference (RFI) test and the EMI radiated emission (RE) test, it is found the EMI value for the high frequency band ranging from 30 MHz to 1G MHz is relatively high and could not be improved by adjusting external circuit parameters or improving circuit layout to meet the client's requirement for a limit value of 0 (dBµV)/m as specified by the EMC tests.

Please refer to the following Tables, which show data obtained from a series of Electromagnetic Interference (EMI) Radiated Emission (RE) tests of a conventional fan used on an automobile and having a filter circuit.

TABLE 1

Data from a series of vertical EMI RE tests

Vertical Result

| Band # | Frequency Band (Hz) | RBW (Hz) | Step Size (Hz) | Dwell Time (ms/Pts) | Polarity | Maximum Emission Freq (MHz) | Level (dBµV)/m | Margin (dB) | Limit (dB µV)/m | Detector | Results |
|---|---|---|---|---|---|---|---|---|---|---|---|
| ND | 76M-108M | 9k | 2.25k | 50 | VP | 107.419 | −11.81 | −6.81 | −5.00 | Avg | Pass |
|    |          |    |       |    |    | 106.62025 | 1.14 | 1.14 | 0.00 | PK | Fail |
| ND | 166M-200M | 1k | 250 | 50 | VP | 195.73925 | −11.60 | −6.60 | −5.00 | Avg | Pass |
|    |           |    |     |    |    | 195.679 | 0.35 | 0.35 | 0.00 | PK | Fail |
| ND | 200M-241M | 1k | 250 | 50 | VP | 205.49025 | −9.25 | −4.25 | −5.00 | Avg | Pass |
|    |           |    |     |    |    | 205.48325 | 6.98 | 6.98 | 0.00 | PK | Fail |
| ND | 310M-320M | 1k | 250 | 50 | VP | 315.4495 | −12.71 | −7.71 | −5.00 | Avg | Pass |
|    |           |    |     |    |    | 315.49975 | 1.17 | 1.17 | 0.00 | PK | Fail |

TABLE 2

Data from a series of horizontal EMI RE tests
Horizontal Result

| Band # | Frequency Band (Hz) | RBW (Hz) | Step Size (Hz) | Dwell Time (ms/Pts) | Polarity | Maximum Emission Freq (MHz) | Level (dBμV)/m | Margin (dB) | Limit (dBμV)/m | Detector | Results |
|---|---|---|---|---|---|---|---|---|---|---|---|
| ND | 76M-108M | 9k | 2.25k | 50 | HP | 100.1875 | −9.46 | −4.46 | −5.00 | Avg | Pass |
|  |  |  |  |  |  | 100.0885 | 4.13 | 4.13 | 0.00 | PK | Fail |
| ND | 166M-200M | 1k | 250 | 50 | HP | 185.38575 | −14.58 | −9.58 | −5.00 | Avg | Pass |
|  |  |  |  |  |  | 185.31275 | −2.39 | −2.39 | 0.00 | PK | Pass |
| ND | 200M-241M | 1k | 250 | 50 | HP | 240.30875 | −12.37 | −7.37 | −5.00 | Avg | Pass |
|  |  |  |  |  |  | 240.121 | 2.54 | 2.54 | 0.00 | PK | Fail |
| ND | 310M-320M | 1k | 250 | 50 | HP | 315.05975 | −15.62 | −10.62 | −5.00 | Avg | Pass |
|  |  |  |  |  |  | 315.0605 | −4.72 | −4.72 | 0.00 | PK | Pass |

Please refer to FIGS. 1A and 1B along with Tables 1 and 2. As can be seen from Table 1, data listed therein are obtained from a series of vertical EMI RE tests (i.e. an antenna used in the tests is in a vertical position) for the high frequency bands ranging from 76 MHz to 320 MHz. In Table 1, the data under the column of Frequency Band [Hz] indicating the frequency bands ranged from 76 MHz to 108 MHz, from 166 MHz to 200 MHz, from 200 MHz to 241 MHz, and from 310 MHz to 320 MHz are sequentially corresponding to the values 1.14, 0.35, 6.98 and 1.17 under the column of Level [dBμV/m]. All these level values have apparently exceeded the limit value of 0 (dBμV/m). That is, the conventional fan with these level values does not pass the tests. On the other hand, in Table 2, data listed therein are obtained from a series of horizontal EMI RE tests (i.e. the antenna used in the tests is in a horizontal position). Data under the column of Frequency Band [Hz] indicating the frequency bands ranging from 76 MHz to 108 MHz and from 200 MHz to 241 MHz are sequentially corresponding to the values 4.13 and 2.54 under the column of Level [dBμV/m]. All these level values are apparently higher than the limit value of 0 (dBμV/m). That is, the conventional fan with these level values does not pass the tests. Further, please refer to FIG. 1A, which is a spectrograph of a series of vertical EMI RE tests for the conventional fan. In FIG. 1A, X-axis indicates Frequency (Hz); Y-axis indicates Level (dBμV/m); the light gray solid line indicates a peak limit line 11; the light gray curve indicates a peak curve 12; the black bold solid line indicates an average limit line 13; and the black bold curve indicates an average curve 14. It can be easily seen from FIG. 1A, portions of the light gray curves located corresponding to the frequency ranged from 76 MHz to 108 MHz, frequency ranged from 200 MHz to 241 MHz, and frequency ranged from 310 MHz to 320 MHz, i.e. portions of the peak curve 12 located in the black frame of FIG. 1A, have already passed beyond the light gray solid line, i.e. the peak limit line 11 of 0 (dBμV)/m. This means the conventional fan is not qualified and does not meet the client required limit value of 0 (dBμV)/m). Please refer to FIG. 1B, which is a spectrograph of a series of horizontal EMI RE tests of the conventional fan. In FIG. 1B, the light gray line is a peak limit line 11, the light gray curve is a peak curve 12, the black bold solid line is an average limit line 13, and the black bold curve is an average curve 14. It can be easily seen from FIG. 1B, portions of the light gray curves located corresponding to the frequency ranged from 76 MHz to 108 MHz and frequency ranged from 200 MHz to 241 MHz, i.e. portions of the peak curve 12 in the black frame of FIG. 1B, have already passed beyond the light gray solid line, i.e. the peak limit line 11 of 0 (dBμV)/m. This means the conventional fan is not qualified and does not meet the client required limit value of 0 (dBμV)/m).

It is therefore desirable to develop a fan structure that overcomes the problem of electromagnetic interference with surrounding sensitive electronic elements or devices as found in the conventional fan structure, and is designed to meet the client's requirements according to the electromagnetic compatibility (EMC) test standards.

SUMMARY OF THE INVENTION

To solve the above problems, it is a primary object of the present invention to provide a fan with electromagnetic radiation shielding structure, with which electromagnetic radiation emitted by magnetically excited windings of a stator structure of the fan can be effectively prevented from leaking out of the fan.

Another object of the present invention is to provide a fan with electromagnetic radiation shielding structure, with which electromagnetic radiation emitted by electronic elements on a circuit board of the fan can be effectively prevented from leaking out of the fan.

To achieve the above and other objects, the fan with electromagnetic radiation shielding structure provided according to the present invention includes a fan impeller and a shaft seat. The fan impeller includes a metal hub, a plurality of blades circumferentially spaced on an outer surface of the metal hub, and a magnetic element provided on an inner surface of the metal hub. The shaft seat is provided at a central area with an upward projected shaft barrel, which is rotatably connected to the fan impeller and has a stator structure externally fitted therearound corresponding to the magnetic element. A metal carrier is provided on the shaft seat and has a peripheral edge extended upward to form a sidewall and define an open-topped receiving space for carrying and receiving the stator structure therein.

In the present invention, the metal hub and the metal carrier together define a shielding space in between them, such that the stator structure located in the shielding space is isolated from outer environment to avoid electromagnetic radiation emitted by the stator structure from leaking out of the shielding space.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
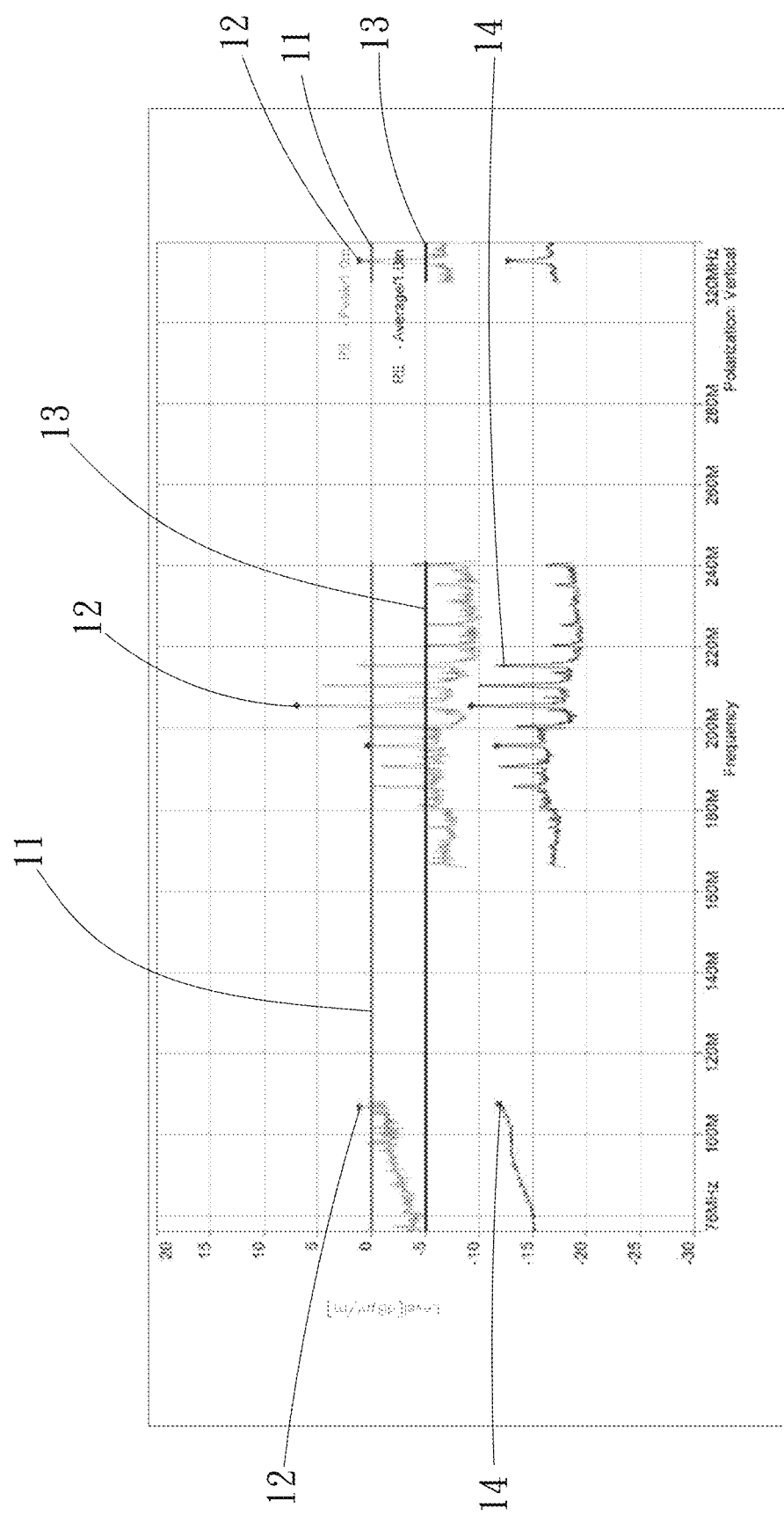
FIG. 1A is a spectrograph of a series of vertical EMI RE tests of a conventional fan.
Figure 1B:
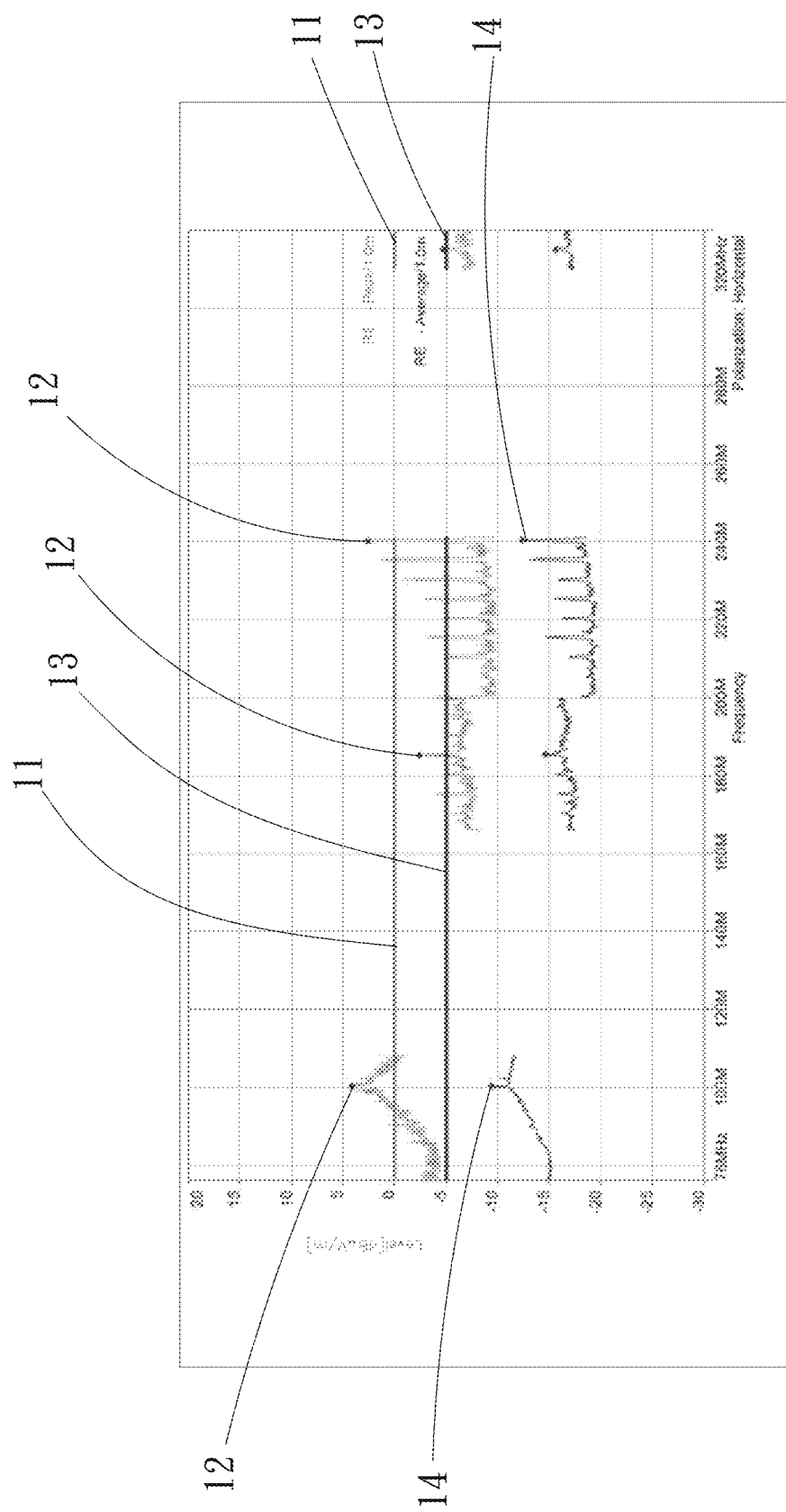
FIG. 1B is a spectrograph of a series of horizontal EMI RE tests of a conventional fan.

The present invention will now be described with some preferred embodiments thereof. For the purpose of easy to understand, elements that are the same in the preferred embodiments are denoted by the same reference numerals.

The present invention provides a fan with electromagnetic radiation shielding structure. For the purpose of simplification and conciseness, the fan with electromagnetic radiation shielding structure according to the present invention is also briefly referred to as the fan and generally denoted by reference numeral 2 herein. Please refer to FIGS. 2A and 2B. The fan 2 is applicable to any one of an axial fan, a centrifugal fan and a frameless fan. The fan 2 includes a shaft seat 21 and a fan impeller 22. A shaft barrel 211 is provided at a central area of the shaft seat 21 to extend upwardly. A stator structure 24 is externally fitted around the shaft barrel 211 and includes a set of silicon steel laminations 241 and a set of windings 242 wound around the silicon steel laminations 241.

The fan impeller 22 is rotatably connected to an inner side of the shaft barrel 211; and includes a metal hub 222 and a plurality of blades 223 circumferentially spaced on an outer surface of the metal hub 222. The metal hub 222 provides an effect of isolating or shielding electromagnetic radiation, and can be made of iron, aluminum, copper, steel, or other metal alloys. The metal hub 222 includes a hub top portion 2221, a hub side wall portion 2222 extending downward from an outer edge of the hub top portion 2221, and a magnetic element 23. The hub top portion 2221 and the hub side wall portion 2222 together define a hood-like hub space 2220 in between them for covering or receiving the stator structure 24 therein. The magnetic element 23 may be, for example, a piece of magnet disposed on an inner surface of the hub side wall portion 2222 and located in the hub space 2220. And, the magnetic element 23 is located radially corresponding to the set of silicon steel laminations 241 of the stator structure 24 that have the windings 242 wound therearound. In practical implementation of the fan 2 of the present invention, the blades 223 and the metal hub 222 may be made of the same metal material and integrally formed. Alternatively, the blades 223 may be first formed by plastic injection molding and then integrally formed on an outer side of the metal hub 222 through overmolding.

Figure 2A:
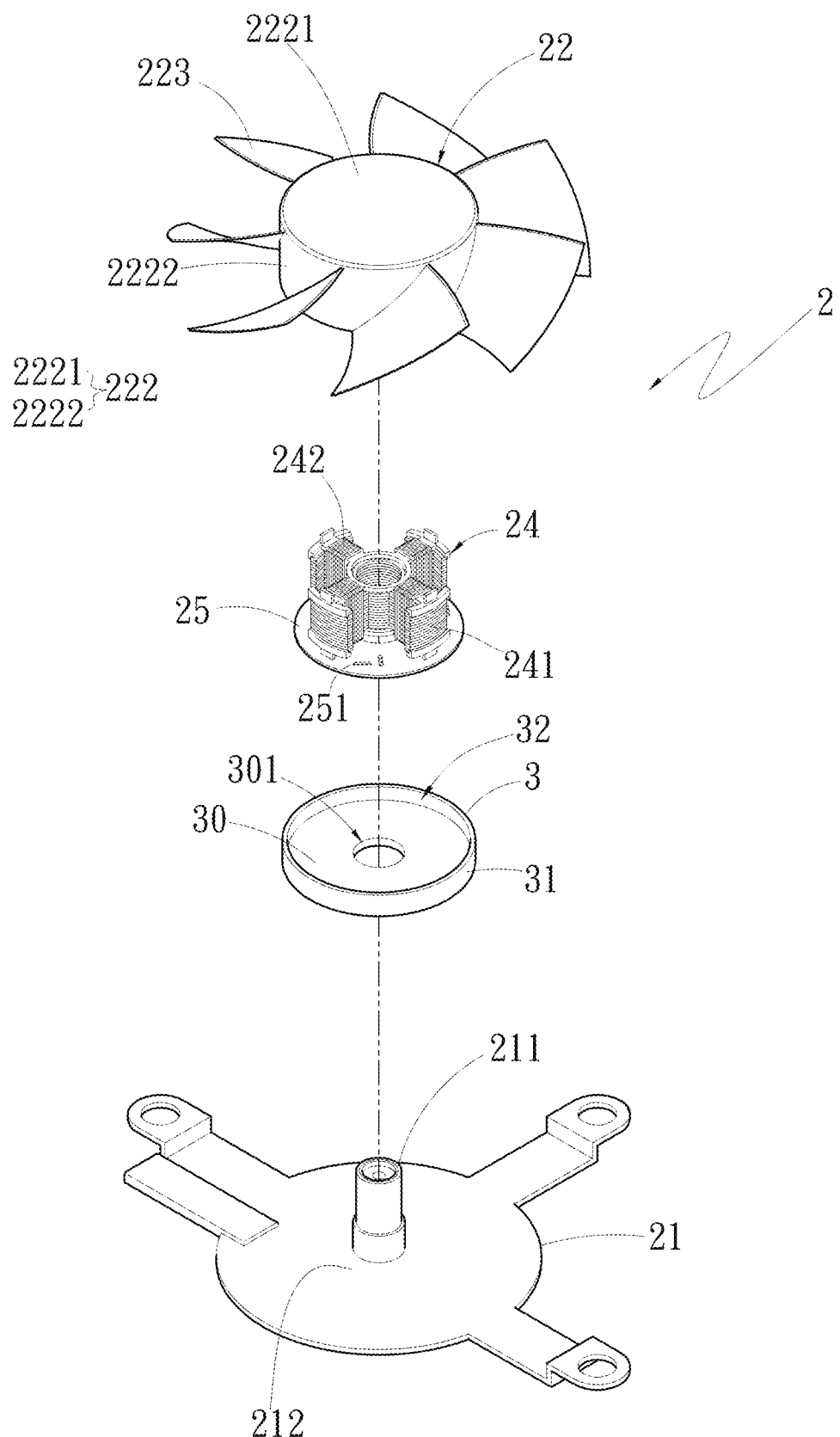
FIG. 2A is an exploded perspective view of a fan with electromagnetic radiation shielding structure according to a first embodiment of the present invention.
Figure 2B:
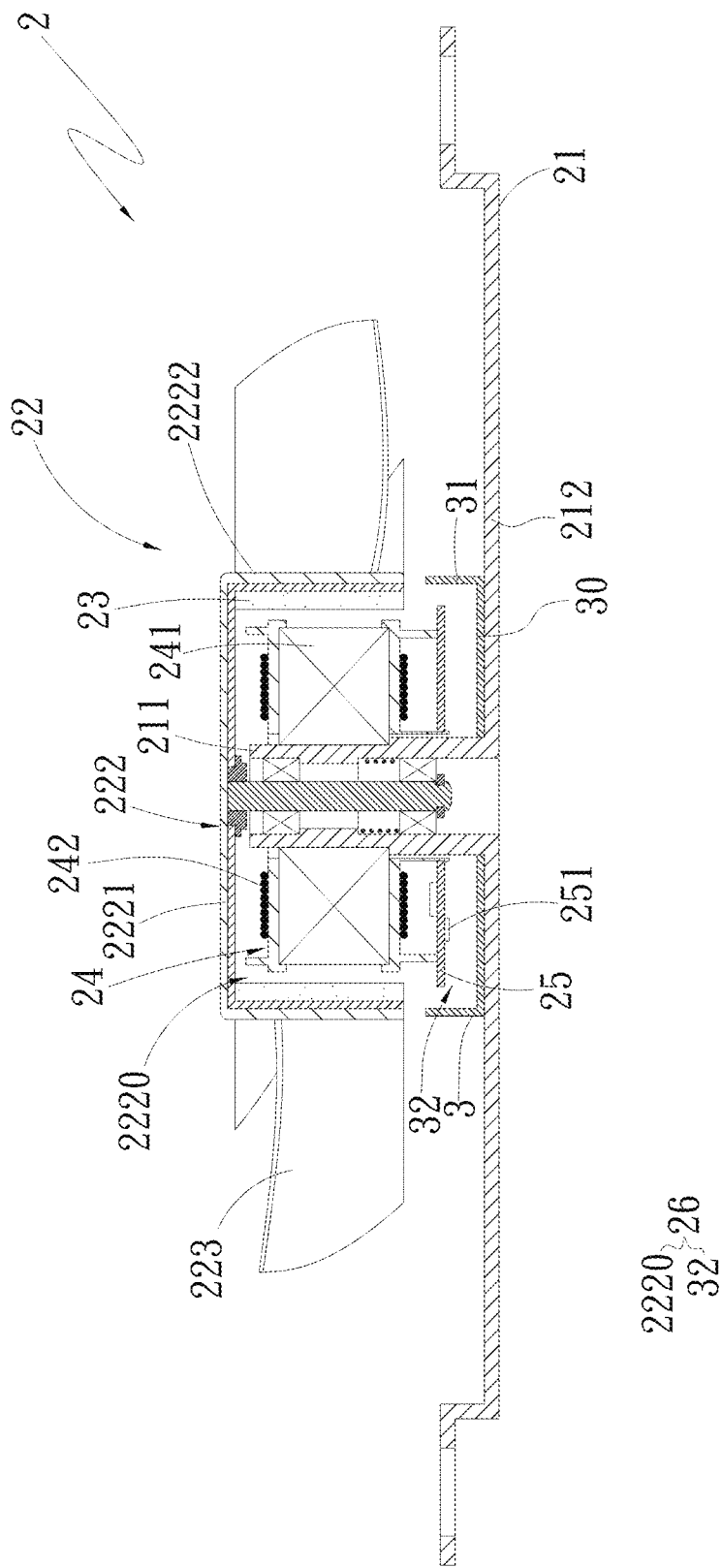
FIG. 2B is an assembled sectional side view of the fan of FIG. 2A.

As can be seen in FIGS. 2A and 2B, the shaft seat 21 includes a bottom portion 212, on which a metal carrier 3 is provided. The metal carrier 3 has the function of isolating, shielding or blocking electromagnetic wave radiation, and is made of iron, aluminum, copper, steel or other metal alloys. It is noted, the metal carrier 3 and the metal hub 222 can be made of the same metal material or different metal materials.

In the illustrated embodiment, the metal carrier 3 is a separate plate-like member, and includes a bottom wall 30, and a sidewall 31 upward extended from an outer periphery of the bottom wall 30. The bottom wall 30 is provided at a central area with a through bore 301 for fitting on around the shaft barrel 211. The bottom wall 30 is situated on the shaft seat 21 and is in parallel to a lower side of the stator structure 24.

The bottom wall 30 and the sidewall 31 of the metal carrier 3 together define an open-topped receiving space 32 for fitly receiving and loading the stator structure 24. The open-topped receiving space 32 is communicable with the hub space 2220 located above the open-topped receiving space 32 and can be covered or closed by the hub space 2220. The hub space 2220 may have an inner diameter larger than or equal to or smaller than that of the receiving space 32; or the hub space 2220 may have an inner diameter larger than or equal to an outer diameter of the metal carrier 3. A circuit board 25 is mounted to a lower inner side of the open-topped receiving space 32 and has a plurality of different electronic elements 251, such as a microprocessor, a single-chip microcontroller unit, a motor driving chip or a motor driving circuit formed of several transistors, provided on one side of the circuit board 25. These electronic elements 251 are electrically connected to an end of the windings 242 of the stator structure 24 via the circuit board 25.

Please refer to FIG. 2B. The metal hub 222 is located above the metal carrier 3 to cover or connect end-to-end to the metal carrier 3, such that the metal hub 22 and the metal carrier 3 together define a shielding space 26 in between them for receiving the stator structure 24 and the circuit board 25 therein. With this arrangement, the stator structure 24 and the circuit board 25 in the shielding space 26 are isolated from outer environment. In other words, the metal hub 222 downwardly covers the stator structure 24 and the circuit board 25 while the metal carrier 3 receives or carries the stator structure 24 and the circuit board 25 thereon, such that the stator structure 24 and the circuit board 25 are enclosed or received in the shielding space 26, which is formed by the communicable receiving space 32 and hub space 2220. With the above arrangements, electromagnetic radiation produced by the windings 242 and the electronic elements 251 during fan operation would be limited to the shielding space 26 without leaking out therefrom. Therefore, other sensitive electronic elements 251 located nearby the fan would not be interfered by the electromagnetic radiation produced by the electronic elements 251 inside the fan.

Please refer to the following Tables, which show data obtained from a series of Electromagnetic Interference (EMI) Radiated Emission (RE) tests of the fan with electromagnetic radiation shielding structure 2 of the present invention when being applied to an automobile:

TABLE 3

Data from a series of vertical EMI RE tests
Suspected List

| NO. | Band | Frequency Band [Hz] | Frequency Hz | Level [B μV/m] | Limit [dB μV/m] | Margin [dB] | Detector | Antenna Polarization | RBW (kHz) | Dwell time [ms] | Result |
|---|---|---|---|---|---|---|---|---|---|---|---|
| 1 | VHF1 | 76M-108M | 79.492M | −2.78 | 0.00 | 2.78 | PK | Vertical | 9 | 50 | PASS |
| 2 | VHF2 | 108M-174M | 140.9365M | −0.02 | 40.00 | 40.02 | PK | Vertical | 9 | 50 | PASS |
| 3 | DAB | 174M-200M | 174.99825M | −7.83 | 0.00 | 7.83 | PK | Vertical | 1 | 50 | PASS |
| 4 | VHF1 | 76M-108M | 76.59625M | −15.14 | −5.00 | 10.14 | AV | Vertical | 9 | 50 | PASS |
| 5 | VHF2 | 108M-174M | 172.00125M | −12.57 | 20.00 | 32.57 | AV | Vertical | 9 | 50 | PASS |
| 6 | DAB | 174M-200M | 174.99825M | −13.25 | −5.00 | 8.25 | AV | Vertical | 1 | 50 | PASS |

TABLE 4

Data from another series of vertical EMI RE tests
Suspected List

| NO. | Band | Frequency Band Hz | Frequency [Hz] | Level [dBμV]/m | Limit [dBμV]/m | Margin [dB] | Detector | Antenna Polarization | Dwell time [ms] | Result |
|---|---|---|---|---|---|---|---|---|---|---|
| 1 | DAB | 200M-24MM | 207.43175M | −5.95 | 0.00 | 5.95 | PK | Vertical | 50 | PASS |
| 2 | DAB | 200M-241M | 212.66875M | −2.44 | 0.00 | 2.44 | PK | Vertical | 50 | PASS |
| 3 | DAB | 200M-241M | 217.80725M | −2.64 | 0.00 | 2.64 | PK | Vertical | 50 | PASS |
| 4 | DAB | 200M-241M | 222.99275M | −4.78 | 0.00 | 4.78 | PK | Vertical | 50 | PASS |
| 5 | DAB | 200M-241M | 228.2025M | −8.18 | 0.00 | 8.18 | PK | Vertical | 50 | PASS |
| 6 | ISM(PKE) | 310M-320M | 315.783M | −9.38 | 0.00 | 9.38 | PK | Vertical | 50 | PASS |
| 7 | DAB | 200M-241M | 207.4625M | −17.87 | −5.00 | 12.87 | AV | Vertical | 50 | PASS |
| 8 | DAB | 200M-241M | 212.6985M | −17.23 | −5.00 | 12.23 | AV | Vertical | 50 | PASS |
| 9 | DAB | 200M-241M | 217.8275M | −16.83 | −5.00 | 11.83 | AV | Vertical | 50 | PASS |
| 10 | DAB | 2008-24188 | 222.8595M | −19.84 | −5.00 | 14.84 | AV | Vertical | 50 | PASS |
| 31 | DAB | 200M-241M | 228.178M | −20.46 | −5.00 | 15.46 | AV | Vertical | 50 | PASS |
| 12 | ISM(PKE) | 310M-320M | 318.7705M | −20.53 | −5.00 | 15.53 | AV | Vertical | 50 | PASS |

TABLE 5

Data from a series of horizontal EMI RE tests
Suspected List

| NO. | Band | Frequency Band [Hz] | Frequency [Hz] | Level [dB μV]/m | Limit [dB μV]/m | Margin [dB] | Detector | Antenna Polarization | RBW (kHz) | Dwell time [ms] | Result |
|---|---|---|---|---|---|---|---|---|---|---|---|
| 1 | VHF1 | 76M-108M | 77.6245M | −2.85 | 0.00 | 2.85 | PK | Horizontal | 9 | 50 | PASS |
| 2 | VHF2 | 108M-174M | 147.681M | −0.91 | 40.00 | 40.91 | PK | Horizontal | 9 | 50 | PASS |
| 3 | DAB | 174M-200M | 196.21275M | −9.05 | 0.00 | 9.05 | PK | Horizontal | 1 | 50 | PASS |
| 4 | VHF1 | 76M-108M | 103.79425M | −15.70 | −5.00 | 10.70 | AV | Horizontal | 9 | 50 | PASS |
| 5 | VHF2 | 108M-174M | 173.736M | −13.07 | 20.00 | 33.07 | AV | Horizontal | 9 | 50 | PASS |
| 6 | DAB | 174M-200M | 193.3315M | −18.32 | −5.00 | 13.32 | AV | Horizontal | 1 | 50 | PASS |

TABLE 6

Data from another series of horizontal EMI RE tests
Suspected List

| NO. | Band | Frequency Band [Hz] | Frequency [Hz] | Level [dB μV]/m | Limit [dB μV]/m | Margin [dB] | Detector | Antenna Polarization | RBW (kHz) | Dwell time [ms] | Result |
|---|---|---|---|---|---|---|---|---|---|---|---|
| 1 | DAB | 200M-241M | 218.03825M | −8.96 | 0.00 | 8.96 | PK | Horizontal | | 50 | PASS |
| 2 | ISM(PKE) | 310M-320M | 316.2515M | −9.51 | 0.00 | 9.51 | PK | Horizontal | | 50 | PASS |
| 3 | DAB | 200M-241M | 224.997M | −21.00 | −5.00 | 16.00 | AV | Horizontal | | 50 | PASS |
| 4 | ISM(PKE) | 310M-320M | 317.7285M | −20.57 | −5.00 | 15.57 | AV | Horizontal | | 50 | PASS |

Figure 3A:
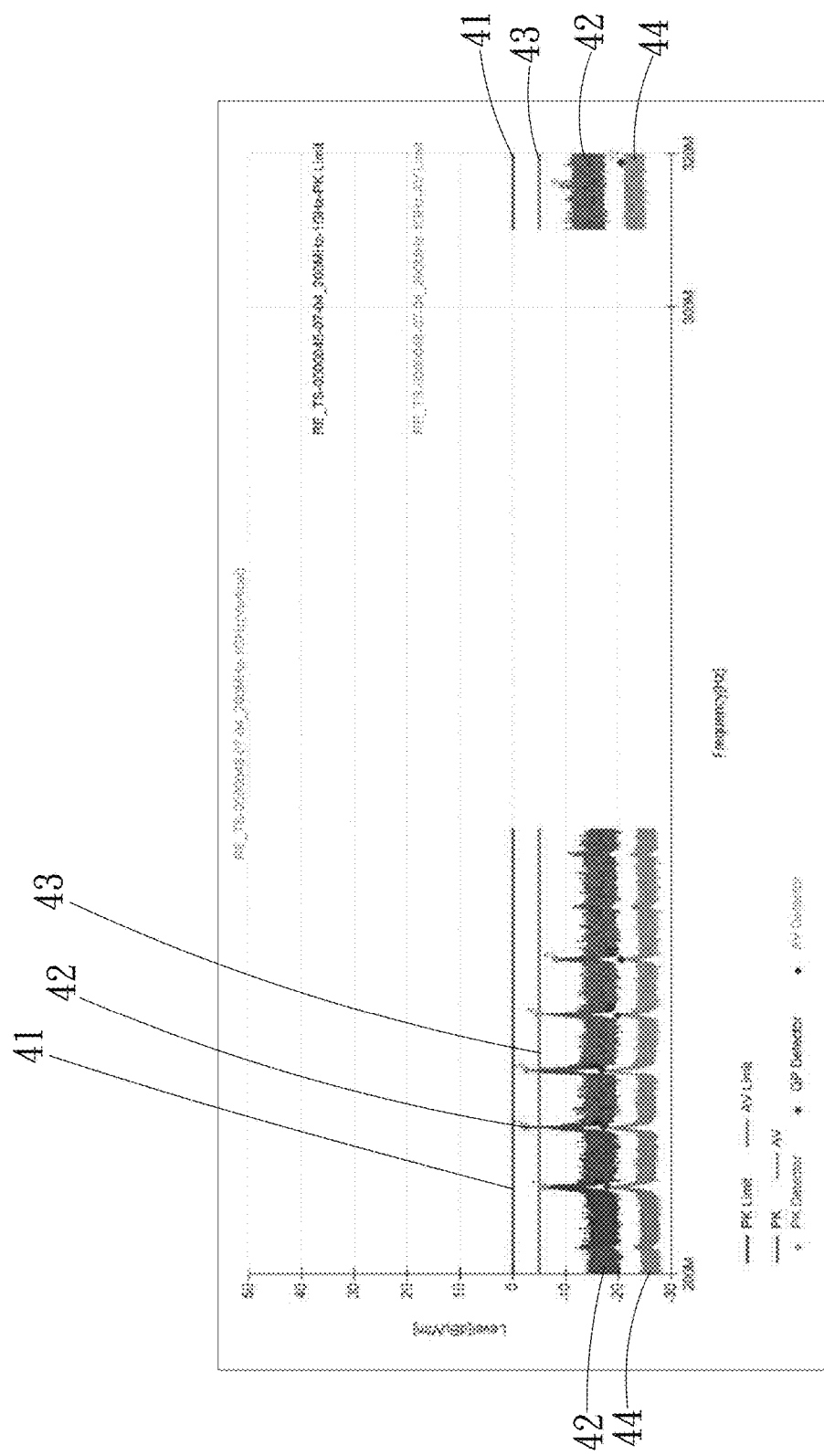
FIG. 3A is a spectrograph of a series of vertical EMI RE tests of a fan according to the present invention.
Figure 3B:
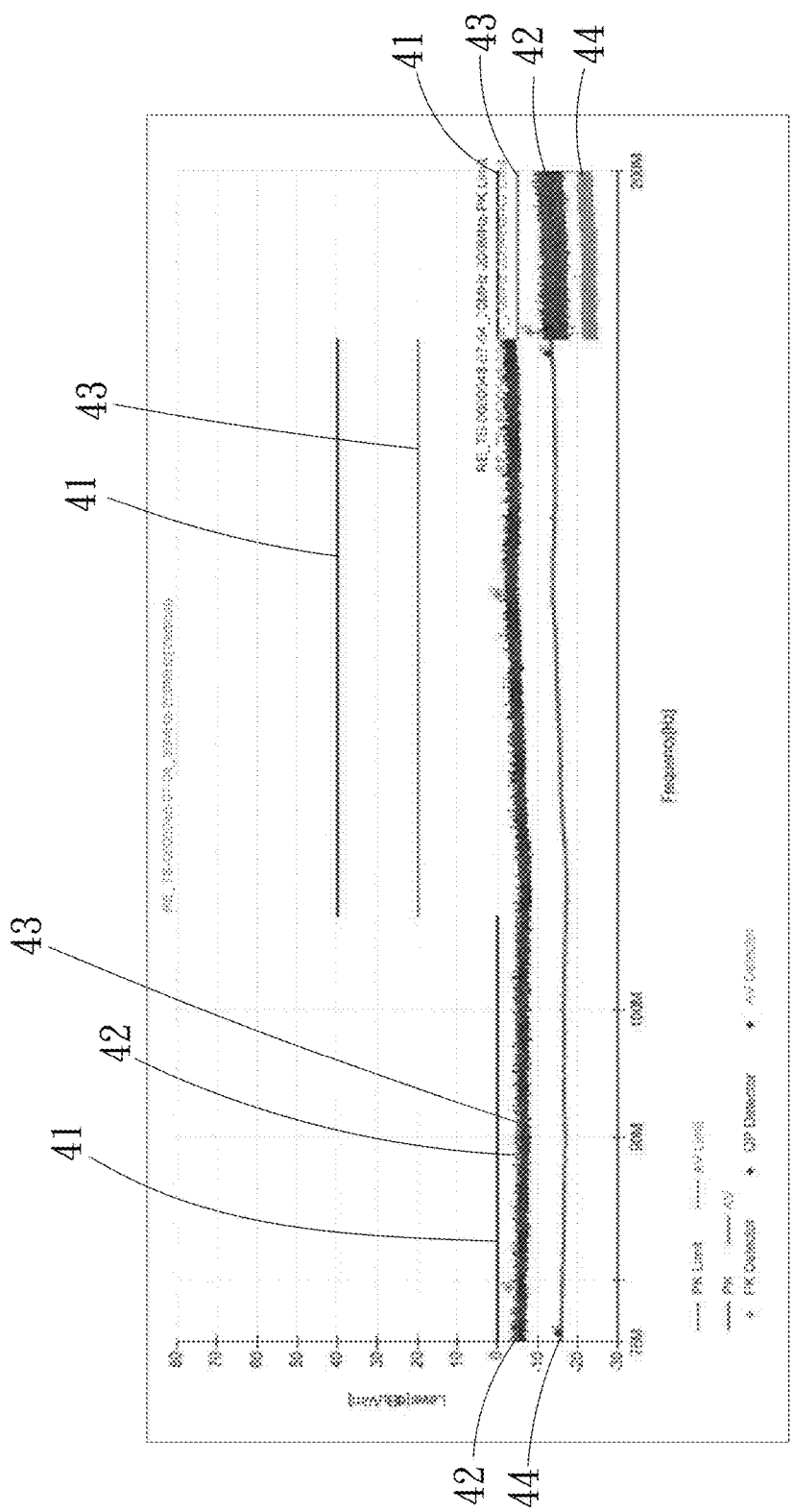
FIG. 3B is another spectrograph of another series of vertical EMI RE tests of a fan according to the present invention.
Figure 4A:
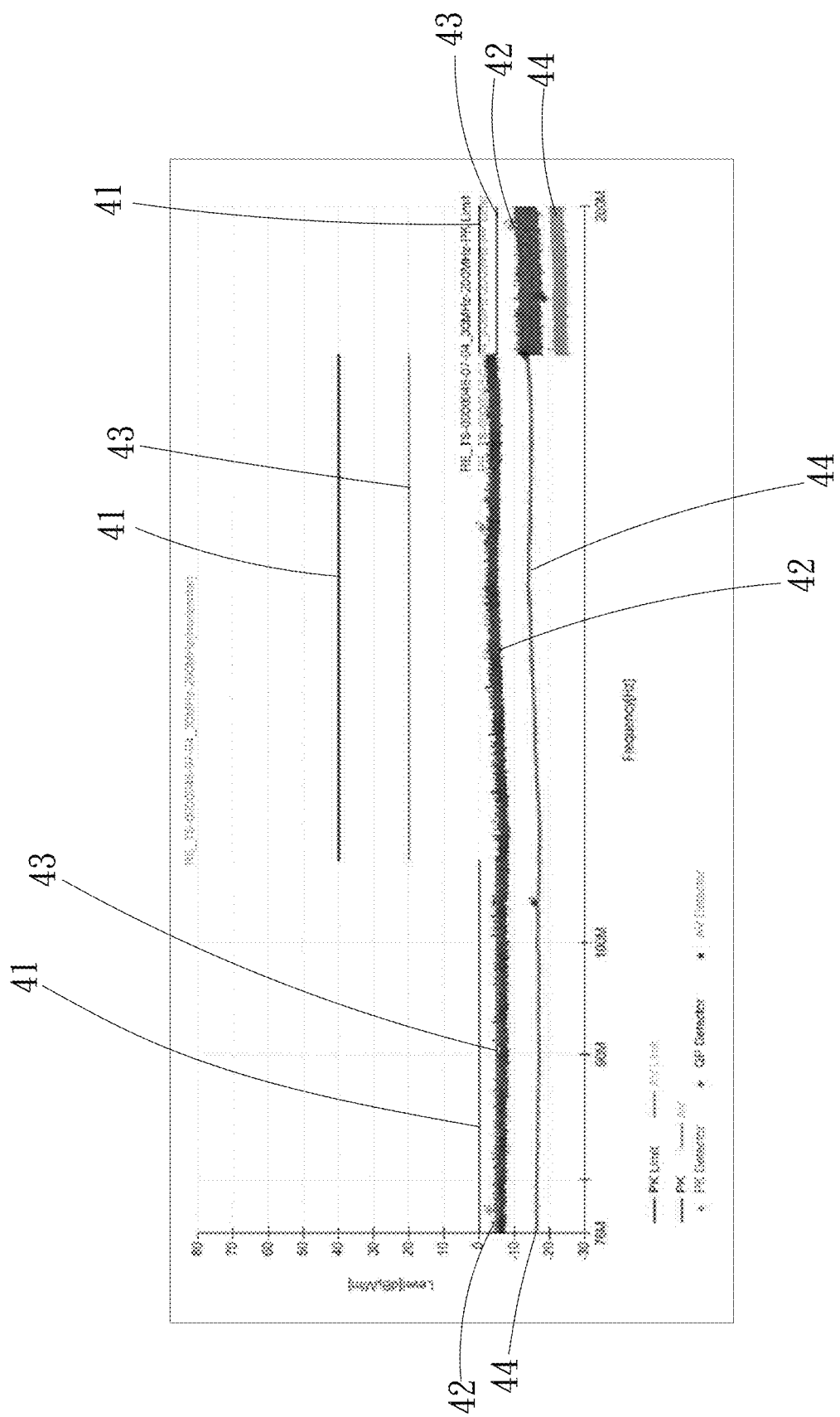
FIG. 4A is a spectrograph of a series of horizontal EMI RE tests of a fan according to the present invention.
Figure 4B:
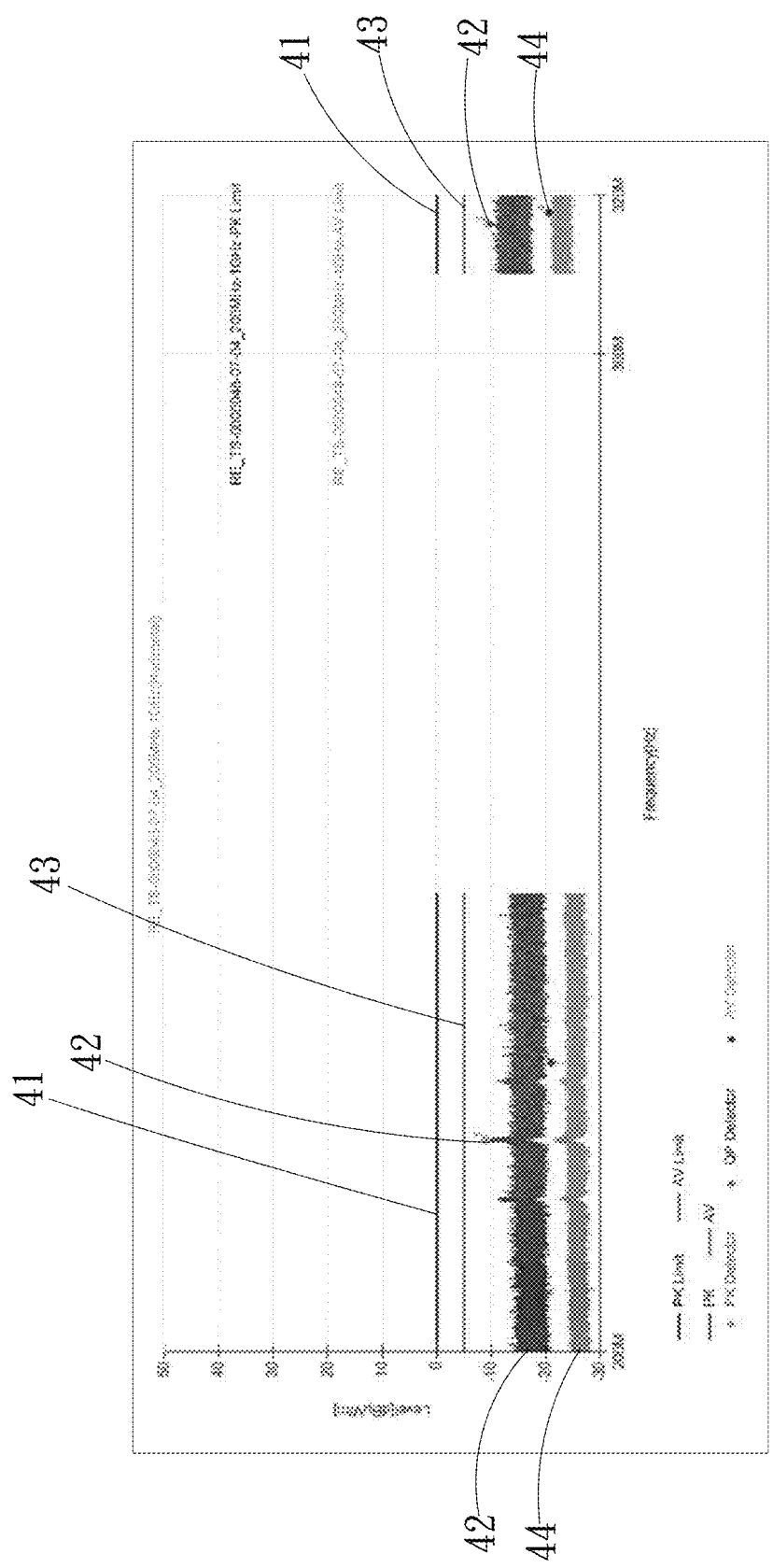
FIG. 4B is another spectrograph of another series of horizontal EMI RE tests of a fan according to the present invention.

Please refer to FIGS. 3A and 3B along with Tables 3 and 4. As can be seen from Tables 3 and 4, data listed therein are obtained from a series of vertical EMI RE tests (i.e. an antenna used in the tests is in a vertical position) for the high frequency band ranged from 76 MHz to 320 MHz. In Tables 3 and 4, the data under the column of Frequency Band [Hz] indicating the frequency bands ranged from 76 MHz 320 MHz are sequentially corresponding to the values under the column of Level [dBµV/m]. All these level values are lower or equal to the limit value of 0 (dBµV)/m. That is, the fan 2 with these test results passes the tests. On the other hand, please refer to FIGS. 4A and 4B along with Tables 5 and 6. Data listed in Tables 5 and 6 are obtained from a series of horizontal EMI RE tests (i.e. the antenna used in the tests is in a horizontal position) for the high frequency band ranging from 76 MHz to 320 MHz. In Tables 5 and 6, data under the column of Frequency Band [Hz] indicating the frequency bands ranged from 76 MHz to 320 MHz are sequentially corresponding to the values under the column of Level [dBµV/m]. All these level values are apparently lower than the limit value of 0 (dBµV)/m. That is, the tests are qualified. Further, please refer to FIGS. 3A and 3B, which are spectrographs corresponding to a series of vertical EMI RE tests of the fan 2 of the present invention; and to FIGS. 4A and 4B, which are spectrographs corresponding to a series of horizontal EMI RE tests of the fan 2 of the present invention. In the spectrographs, X-axis indicates Frequency (Hz), and Y-axis indicates Level (dBµV/m). In FIGS. 3A to 4B, the black bold solid line indicates a peak limit line 41, the black bold curve is a peak curve 42, the light gray solid line indicates an average limit line 43, and the light gray curve is an average curve 44. As can be seen in each of FIGS. 3A to 4B, the black bold curve, i.e. the peak curve 42, corresponding to the frequency ranged from 76 MHz to 320 MHz is completely lower than the black bold solid line, i.e. the peak limit line 41 of 0 (dBµV)/m. This means the fan 2 of the present invention is qualified and satisfies the client-required limit value of 0 (dBµV)/m. Therefore, it is proven the electromagnetic waves produced by the windings 242 and the electronic elements 251 inside the fan 2 during operation thereof are effectively prevented from radiating into surrounding air, and no electromagnetic wave would be received by an EMC testing device, such as an EMI receiver. This means the fan 2 according to the present invention would not cause electromagnetic interference (EMI) with other devices in the vicinity of the fan 2. Some examples of currently available EMC testers include EMI receiver, Peak detector (PKD), Average (AV) detector and Quasi-Peak detector (QPD), spectrum (signal) analyzer, and other relevant instruments (devices).

While the shaft seat 21 in the illustrated embodiment does not have a sidewall protruded along an outer periphery of the shaft seat 21, it is understood the present invention is not limited thereto. The type of the fan 2 according to the present invention may be differently designed based on intended usages, such as an axial fan. In the embodiment of having an axial fan 2, the shaft seat 21 includes a sidewall (not shown) raised from and extended along a circumferential edge of the shaft seat 21 to define a receiving space between the shaft barrel 211 and the sidewall. The metal carrier 3 is rotatably connected to the shaft seat 21 and located in the receiving space defined between the sidewall and the shaft barrel 211.

In the above described embodiment, the metal carrier 3 is a separate element (i.e. not an integral part of the metal carrier 3) connected to between the shaft seat 21 and the stator structure 24. However, the present invention is not intended to be limited thereto. In another embodiment, the metal carrier 3 is integrally formed with the shaft seat 21 by way of overmolding. That is, when the metal carrier 3 and the shaft seat 21 are formed by way of plastic injection molding at the same time, the bottom wall 30 of the metal carrier 3 is wrapped in the plastic material forming the bottom portion 212 of the shaft seat 21 while the sidewall 31 of the metal carrier 3 is extended upward from the shaft seat 21. Thus, the sidewall 31 of the metal carrier 3 and the metal hub 222 located above it can be closed to one another to define the above-said shielding space 26. With the shielding space 26, the stator structure 24 and/or the circuit board 25 in the fan 2 is isolated from other space outside the shielding space 26, and it is possible to prevent electromagnetic wave produced by the stator structure and the electronic elements from leaking out of the fan 2.

In an alternative embodiment, the hub side wall portion 2222 includes an extension (not shown), which extends downward from a lower edge of the hub side wall portion 2222 toward the bottom wall 30 of the metal carrier 3 to a position facing the sidewall 31 of the metal carrier 3. More specifically, the extension of the metal hub 222 encloses around the sidewall 31 of the metal carrier 3 to largely upgrade the effect of preventing electromagnetic wave leakage.

In the prevent invention, the metal hub 222 downward covers the stator structure 24 and the metal carrier 3 upward encloses the circuit board 25, such that the stator structure 4 and the circuit board 25 are received in the shielding space 26. With these arrangements, it is able to effectively prevent leakage of electromagnetic waves produced during the operation of the stator structure 4 and the circuit board 25 and to get enhanced electromagnetic radiation shielding effect.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A fan with electromagnetic radiation shielding structure comprising:
   a fan impeller including a metal hub, a plurality of blades circumferentially spaced on an outer surface of the metal hub, and a magnetic element provided on an inner surface of the metal hub;
   a shaft seat provided at a central area thereof with an upward projected shaft barrel, which is rotatably connected to the fan impeller;
   a stator structure externally fitted around the shaft seat; and
   a metal carrier configured as a separate plate-like member and provided on the shaft seat and the metal carrier having a continuous peripheral edge extended upward to form a sidewall and define an open-topped receiving space for carrying and receiving the stator structure therein; the metal hub and the metal carrier together defining a shielding space in between them, such that the stator structure is located in the shielding space and is isolated from outer environment to avoid electromagnetic radiation produced by the stator structure from leaking out of the fan.

2. The fan with electromagnetic radiation shielding structure as claimed in claim 1, further comprising a circuit board mounted in the receiving space defined by the metal carrier and having a plurality of electronic elements mounted thereon; the circuit board being electrically connected to a set of windings of the stator structure; and the windings and the electronic elements on the circuit board being located in the shielding space and isolated from external environment, such that electromagnetic radiation produced by the windings and the electronic elements during operation thereof is prevented from leaking out of the fan.

3. The fan with electromagnetic radiation shielding structure as claimed in claim 1, wherein the metal hub includes a hub top portion and a hub side wall portion extending downward from an outer edge of the hub top portion.

4. The fan with electromagnetic radiation shielding structure as claimed in claim 1, wherein the stator structure includes a set of silicon steel laminations and a set of windings wound around the silicon steel laminations; and the silicon steel laminations of the stator structure being located radially corresponding to the magnetic element disposed in the metal hub.

5. The fan with electromagnetic radiation shielding structure as claimed in claim 1, wherein the metal carrier is connected to the shaft seat.

* * * * *